(12) United States Patent
Ainspan et al.

(10) Patent No.: US 7,750,701 B2
(45) Date of Patent: Jul. 6, 2010

(54) PHASE-LOCKED LOOP CIRCUITS AND METHODS IMPLEMENTING MULTIPLEXER CIRCUIT FOR FINE TUNING CONTROL OF DIGITALLY CONTROLLED OSCILLATORS

(75) Inventors: Herschel A. Ainspan, New Hempstead, NY (US); Daniel J. Friedman, Sleepy Hollow, NY (US); Alexander V. Rylyakov, Mount Kisco, NY (US); Jose A. Tierno, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/173,159

(22) Filed: Jul. 15, 2008

(65) Prior Publication Data

US 2010/0013532 A1 Jan. 21, 2010

(51) Int. Cl.
*H03L 7/06* (2006.01)
(52) U.S. Cl. .................. 327/159; 327/156; 327/162; 375/376
(58) Field of Classification Search .............. 327/141, 327/144–163; 331/15–17, 1 A; 375/373–376
See application file for complete search history.

(56) References Cited

U.S. PATENT DOCUMENTS

| 5,313,503 | A | 5/1994 | Jones et al. |
|---|---|---|---|
| 6,028,488 | A | 2/2000 | Landman et al. |
| 7,352,297 | B1 * | 4/2008 | Rylyakov et al. .............. 341/50 |
| 2002/0033732 | A1 | 3/2002 | Kirn |
| 2002/0033737 | A1 * | 3/2002 | Staszewski et al. ........... 331/17 |
| 2002/0079937 | A1 | 6/2002 | Xanthopoulos |
| 2003/0107442 | A1 | 6/2003 | Staszewski |
| 2004/0066240 | A1 | 4/2004 | Staszewski et al. |
| 2007/0085621 | A1 | 4/2007 | Staszewski et al. |
| 2007/0205931 | A1 | 9/2007 | Vanselow et al. |

OTHER PUBLICATIONS

Tierno et al., A Wide Power Supply Range, Wide Tuning Range, All Static CMOS All Digital PLL in 65 nm SOI; IEEE Journal of Solid-State Circuits, vol. 4, No. 1; Jan. 2008; pp. 1-10.

* cited by examiner

*Primary Examiner*—Lincoln Donovan
*Assistant Examiner*—Brandon S Cole
(74) *Attorney, Agent, or Firm*—Tutunjian & Bitetto, P.C.; Anne V. Dougherty, Esq.

(57) ABSTRACT

Circuits and methods are provided in which fine tuning control of a DCO (digitally controlled oscillator) circuit in a digital PLL circuit is realized by dither controlling a multiplexer circuit under digital control to selectively output one of a plurality of analog control voltages with varied voltage levels that are input to a fractional frequency control port of the DCO to drive tuning elements of the DCO at fractional frequency resolution and achieve continuous fine tuning of the DCO under analog control.

16 Claims, 3 Drawing Sheets

PHASE-LOCKED LOOP CIRCUITS AND METHODS IMPLEMENTING MULTIPLEXER CIRCUIT FOR FINE TUNING CONTROL OF DIGITALLY CONTROLLED OSCILLATORS

TECHNICAL FIELD OF THE INVENTION

The present invention relates generally to digital PLL (phase locked loop) circuits and, in particular, circuits and methods to provide fine tuning control of a DCO (digitally controlled oscillator) circuit in a digital PLL circuit by dither controlling a multiplexer circuit to selectively output one of a plurality of analog control voltages with varied voltage levels to driving tuning elements of the DCO at fractional frequency resolution and achieve continuous fine tuning of the DCO.

BACKGROUND

In general, various types of communications systems are implemented using phase-locked loop (PLL) circuits to generate clock signals. For example, PLL circuits are used in transceiver circuits for generating LO (local oscillator) signals, data recovery circuits for generating clock recovery signals, and frequency synthesizer circuits for generating stable frequency output signals over a large continuous tuning range. In general, a PLL circuit uses feedback to maintain an output signal of the PLL in a specific phase relationship with a reference input signal of the PLL, as is well known in the art. When the output frequency of the PLL is equal to the frequency of the reference input signal, the PLL is in a "locked" condition. A frequency synthesizer circuit is essentially a PLL circuit that employs a programmable frequency divider in a PLL feedback loop. PLL circuits can be implemented using analog and/or digital circuits, depending on the application.

By way of example, FIG. 9 is a high-level schematic illustration of a conventional analog PLL frequency synthesizer circuit (10). The PLL frequency synthesizer (10) comprises a PFD (phase-frequency detector) circuit (11), a charge pump (12), a loop filter (13), a VCO (voltage controlled oscillator) circuit (14), and a frequency divider (15) in a PLL feedback loop. In general, the PLL frequency synthesizer (10) generates an output signal Vout having a frequency $f_{out}$ that is some multiple N of the frequency $f_{Ref}$ of a reference clock signal Ref_CLK, where $f_{out}=N \times f_{Ref}$. The PFD circuit (11) receives the input reference signal Ref_CLK and a feedback signal $f_{Div}$ and compares the phases of such signals. The PFD (11) generates a slowly varying phase error output signal that is a function of the phase difference between the reference and feedback signals. The charge pump (12) operates in conjunction with the PFD (11) to generate an output current signal based on the detected phase difference using matched current sources. In general, the charge pump (12) and loop filter (13) operate to amplify and filter the phase error signal output from the PFD (11) according to a filter transfer function that is selected to achieve desired loop characteristics such as gain, bandwidth, frequency response, etc., in a manner well known in the art. The loop filter (13) built from resistors and capacitors low-pass filters the phase error signal generated by the PFD (11) and CP (12) and outputs a control voltage to the VCO (14).

The control voltage output from the loop filter (13) is a control signal that is input to a control port of the VCO (14). The VCO (14) may be a voltage controlled LC tank oscillator where frequency tuning is achieved based on the voltage level of the control signal output from the loop filter (13). The control signal could be applied to a variable capacitor or varactor in the case of an LC (inductor-capacitor) VCO, or applied to one or more current sources in the case of a current-starved or delay-interpolating ring VCO. The control signal voltage incrementally increases or decreases so as to drive the VCO (14) output frequency $f_{out}$ in the direction of $N \times f_{Ref}$. The output signal $V_{out}$ is fed back to the PFD (11) via the frequency divider circuit (15), which divides the VCO output frequency by the division ratio N to generate a low frequency signal $f_{Div}$. When $f_{Ref}=f_{Div}$, the PLL frequency synthesizer achieves the desired "locked" state.

In advanced semiconductor technologies, the ability to realize good analog PLL circuit performance is problematic, especially as target supply voltages are reduced and operating frequencies increase. Moreover, for mixed digital/analog integrated circuit designs, the realization of a PLL using traditional analog frameworks places demands on the underlying process technology which are significantly different from those driven by high-speed digital logic requirements. Indeed, analog PLL circuits typically require elements that are not used in standard digital logic circuits such as resistors and low leakage capacitors, and analog circuits rely on properties that are not critical to standard logic circuits such as matching and output impedance uniformity.

In this regard, all digital PLL circuit topologies have been developed to address issues associated with analog PLLs. In general, a digital PLL includes a digital phase detector, a digital loop filter (instead of the traditional analog filter), and a digitally-controlled oscillator (DCO) (instead of a VCO as in the analog PLL). A DCO is an oscillator that operates at a frequency controlled by the value of a digital control word that is generated by the digital loop filter. With digital PLLs, signal processing and filtering is performed in the digital domain and a digitally-realized loop filter is much smaller in framework and is more programmable than the capacitor-dependent analog filter frameworks used in analog PLLs.

The digital loop filter provides a digital output that is used as a control signal to frequency tune the DCO. In general, a DCO includes tuning control circuits with tuning elements that are driven by the digital control word logic inputs. The DCO tuning elements may include, for example, non-linear capacitors in an LC DCO that are driven on and off by the control signals to frequency tune the DCO. In other conventional embodiments, the DCO elements may be a plurality of active inverter stages in a ring DCO, wherein frequency tuning is achieved by incrementing/decrementing the number of active inverter stages in a ring DCO.

The digital PLL requires a continuous tuning range, which means that small frequency steps are needed. For example, in a ring DCO, a single frequency step is equivalent to the delay of a unit cell inverter, and in an LC DCO, a frequency step is a capacitance of a unit cell varactor. If the frequency step between adjacent digital control settings is too large, however, it will not be possible to realize a PLL with a low-noise output. One method of providing a lower incremental frequency change per digital step is by using smaller tuning elements (e.g., smaller inverters or varactors). However, the ability to achieve the required fine-grain digital tuning of the LC DCO using this approach can be problematic because there are inherent tradeoffs between fixed capacitance and controllable capacitance associated with changing the size of the digitally controlled capacitor. Indeed, the smaller the controllable step, the more fixed capacitance is introduced as a fraction of total capacitance, and thus the smaller the achievable overall DCO tuning range becomes. The growth in fixed capacitance occurs in large part because the wiring needed to connect the digitally controlled capacitors grows as capacitor count grows. Furthermore, there may be process technology limits that affect how small a controllable capacitor can be.

In other conventional methods, fine tune control of DCOs can be implemented by using dither control circuits such as sigma delta modulator circuits to encode fractional frequency control bits into dithering signal that are input to the DCO to increase the frequency tuning resolution by rapidly switching tuning elements on and off. Although the dithered control process enhances resolution, the dither control bit still provides a large frequency step based on the size of each unit tuning element of the DCO. Moreover, once the switching frequency is realized as high as possible (limited by the electronics, available clock rates, power dissipation), and the step size is minimized the step size, dithered control may be insufficient to achieve the desired tuning accuracy. As such, new techniques to further enhance the frequency tuning resolution of DCO circuits in PLL circuits and other circuits are highly desirable.

SUMMARY OF THE INVENTION

In general, exemplary embodiments of the invention include digital PLL (phase locked loop) circuits and, in particular, circuits and methods to provide fine tuning control of a DCO (digitally controlled oscillator) circuit in a digital PLL circuit by dither controlling a multiplexer circuit to selectively output one of a plurality of analog control voltages with varied voltage levels to driving tuning elements of the DCO at fractional frequency resolution and achieve continuous fine tuning of the DCO.

More specifically, in one exemplary embodiment of the invention, a phase-locked loop (PLL) circuit includes a digitally controlled oscillator (DCO) circuit, a dither control circuit and a multiplexer circuit. The DCO circuit generates a DCO output signal in response to a digital frequency tuning control signal comprising an integer portion and a fractional portion. The dither control circuit encodes the fractional portion of the digital frequency tuning control signal to generate a dither control signal. The multiplexer circuit has a plurality of input ports each configured to receive a corresponding one of a plurality of analog control voltages within a fixed voltage range, an output port connected to a fractional frequency control port of the DCO, and a select control port that receives the dither control signal, wherein the multiplexer circuit selectively outputs one of the analog control voltages to the fractional frequency control port of the DCO in response to the dither control signal to drive a fractional frequency tuning element of the DCO using the analog control voltage.

With this exemplary framework, frequency tuning a DCO can be realized under digital control using the integer portion of the digital frequency tuning control signal for coarse tuning control and under analog control using the analog control voltages to drive a fractional frequency tuning element of the DCO for fine resolution tuning control.

These and other exemplary embodiments, features and advantages of the present invention will be described or become apparent from the following detailed description of exemplary embodiments, which is to be read in connection with the accompanying drawings.

DETAILED DESCRIPTION OF EXEMPLARY EMBODIMENTS

Figure 1:
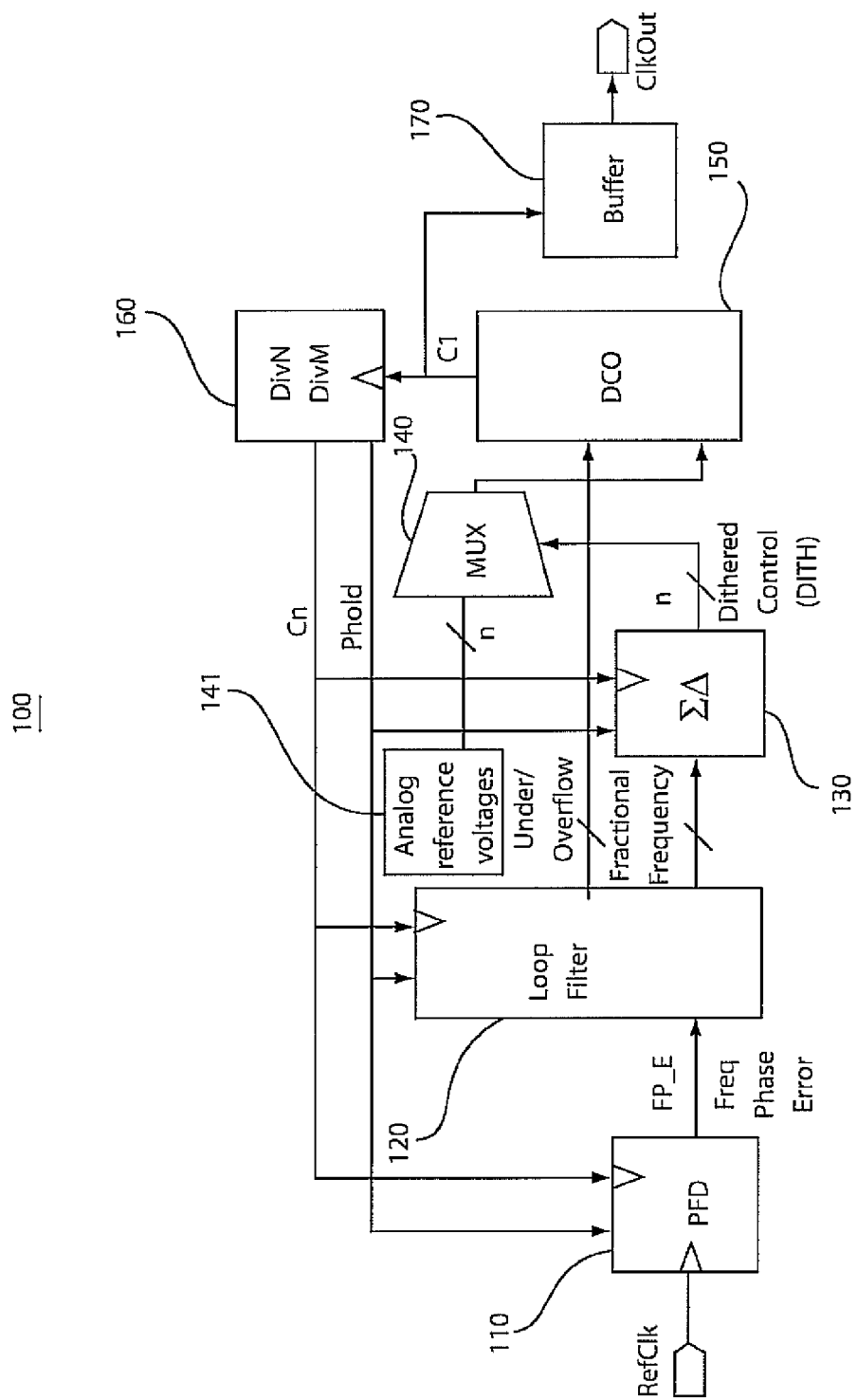
FIG. 1 is a schematic block diagram of a digital PLL (phase locked loop) circuit implementing a multiplexer circuit with dithered control for fine tune control of a digitally controlled oscillator, according to an exemplary embodiment of the invention.

FIG. 1 is a schematic block diagram of a digital phase locked loop (DPLL) circuit (100) according to an exemplary embodiment of the invention. The DPLL (100) comprises a phase/frequency detector (110) (or "PFD" circuit), a digital loop filter (120), a sigma/delta modulator (130) (or "SDM" circuit), a multiplexer circuit (140) (or "MUX" circuit), an analog voltage reference generator (141), a digitally controlled oscillator circuit (150) (or "DCO" circuit), a frequency divider (160), and an output buffer (170). The DPLL circuit (100) generally operates as follows.

The digitally controlled oscillator (DCO) circuit (150) generates a DCO output signal (C1) in response to frequency tuning control signals which, as explained below, are generated and output from the loop filter (120) and MUX (140) and input to tuning control ports of the DCO (150). The output signal C1 of the DCO (150) is input to the buffer (driver) (170), which drives the output clock ClkOUT of the DPLL (100).

The output signal C1 of the DCO (150) is input to the frequency divider (160) which divides the frequency of DCO output signal (C1) by a user-settable ratio (DivN, DivM) to generate a divided frequency output signal CN and a clock gating signal Phold (or phase hold), respectively, wherein N can be an integer value in a range of 1 to 8, for example. The Phold signal is used to gate the CN signal effectively creating a slower clock C1/(N×M).

The PFD (110) compares the reference clock REF_Clock and divided clock CN and generates frequency/phase error (FP_E) signal. In one exemplary embodiment of the invention, the PFD (110) is a "bang-bang" phase and frequency detector (PFD) that compares arrival times of the reference clock REF_Clock and divided clock CN edges and generates early/late information. During a frequency capture period, the output of the PFD (110) indicates whether the frequency of the REF_Clk or the CN signal is higher. Once the two frequencies are sufficiently close, the output of the PFD indicates, with some amount of delay, the leading phase (where the late signal indicates that the REF_Clk leads and wherein the early signal indicates that the CN signal leads).

The loop filter (120) filters the FP_E signal to generate a DCO tuning control signal for the DCO (150). The control signal output from the loop filter (120) is divided into most significant bits (under/overflow control bits) that are directly input to the DCO (150) and least significant bits (fractional frequency control bits) that are input to the SDM (130). The loop filter (120) may be a programmable, digital proportional-differential-integral (PDI) digital filter that operates at the divided output frequency CN to generate control signals for the DCO. A proportioned-differential section of the loop filter generates an overflow or underflow, which in input to the DCO for digital control tuning at a coarse level. The fractional frequency control bits are obtained by adding the output of the integrator and the proportional-differential section, wherein the quantity is the "fractional frequency", as it encodes a step size that is a fraction of a minimum DCO discrete step.

The SDM (130) is used to encode the fractional frequency generated by the loop filter (120) into dithering signals DITH.

The SDM circuit (130) converts the target fractional value into an n-bit dither control signal that controls the multiplexer (140). In contrast to conventional circuits where the dithered control signal DITH is directly input to a dither control input port of the DCO (150), in accordance with an exemplary embodiment of the invention, the dither control signals DITH are input to a select control input of the MUX (140) to thereby control the MUX (140) to selectively output one of a plurality of analog reference voltages at the inputs to the MUX (140), which are generated and supplied by the analog reference voltage generator (141). The MUX (140) output (analog reference voltage) is input to a fractional frequency control port of the DCO (150) and applied to a controlled element in the DCO such as a varactor in the case of an LC DCO or current to a current mirror in the case of a ring DCO for example, to achieve continuous fine tuning of the DCO.

The use of a multiplexer in an all digital PLL to switchably select one of a plurality of analog reference voltages within a fixed range of voltage values to a controlled element in the DCO allows realization of a lower incremental frequency change per digital step in the DCO and thus achieve fine, continuous tuning of the DCO while using a simple analog circuit to generate the fixed range of analog values for input to the multiplexer. The number of analog values can be arbitrarily large to achieve very continuous tuning, and can be generated easily using circuits such as a resistive divider network between VDD and GND.

Figure 2:
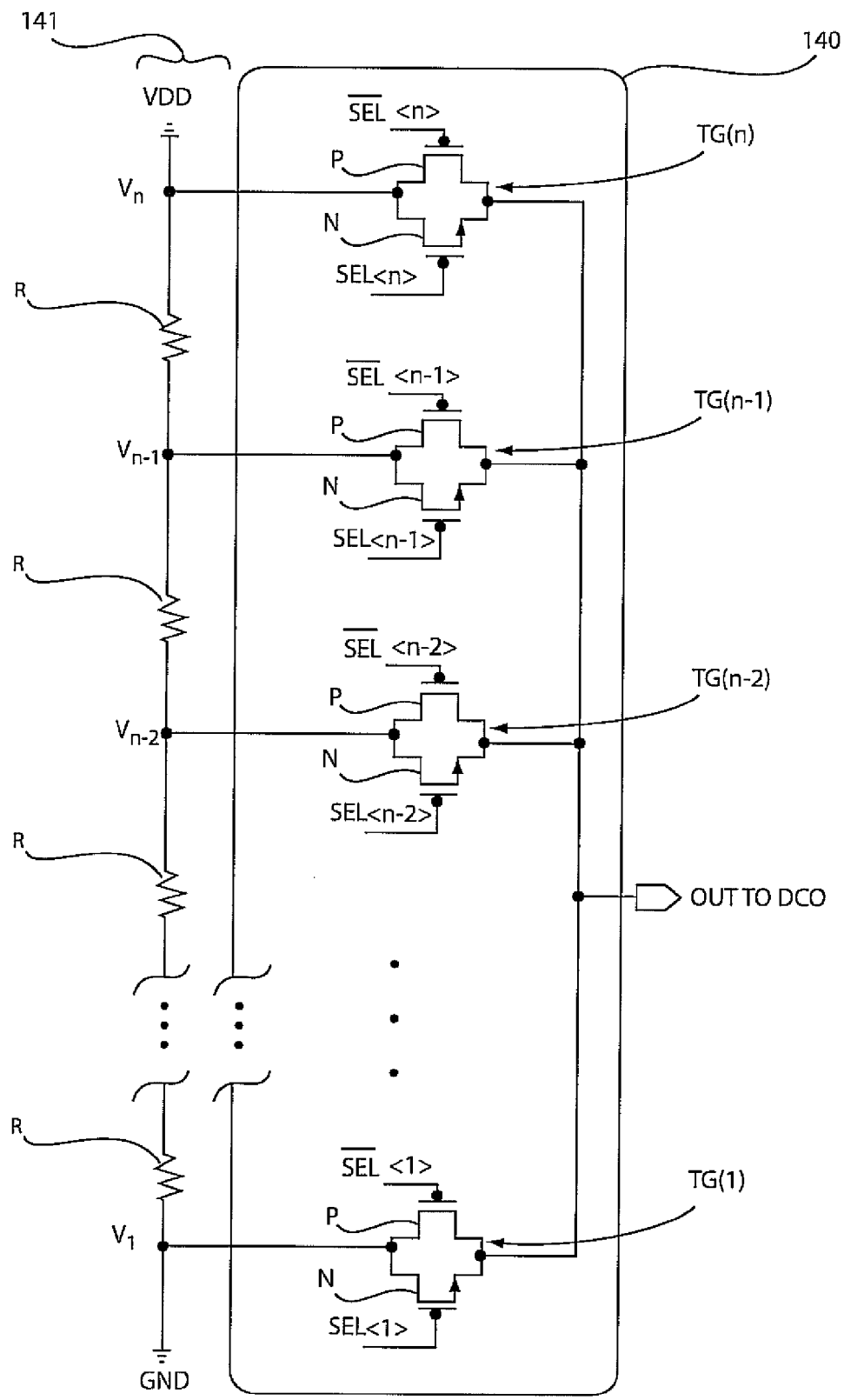
FIG. 2 schematically illustrates an analog reference voltage generator and multiplexer circuit with dithered control that may be implemented in the PLL circuit of FIG. 1, according to an exemplary embodiment of the invention.
Figure 3:
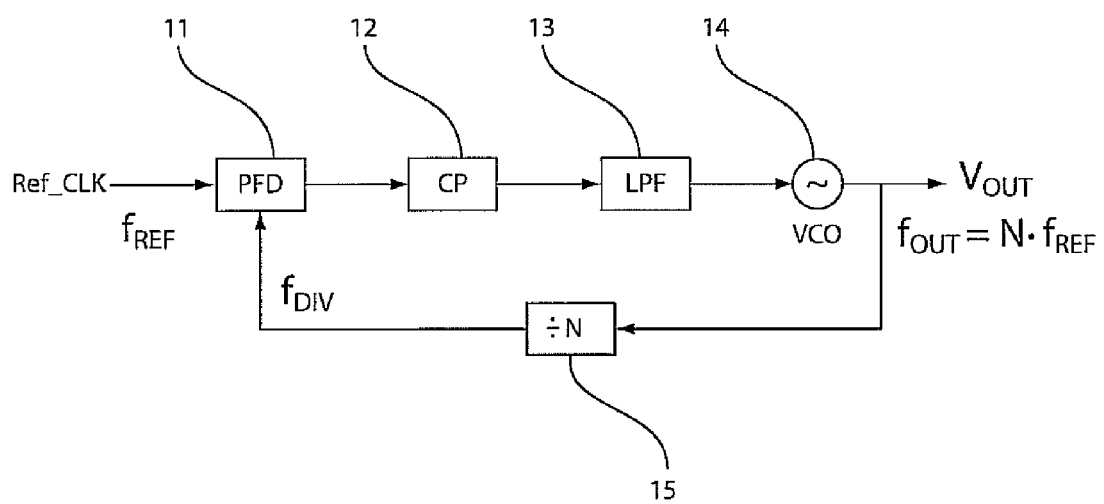
FIG. 3 is a schematic block diagram of a conventional phase-locked loop circuit.

FIG. 2 illustrates an analog reference voltage generator and MUX circuit according to an exemplary embodiment of the invention. In particular, FIG. 2 illustrates a voltage divider network (1411) as an exemplary embodiment of the analog reference voltage generator (141) of FIG. 1. The voltage divider network (141') comprises a plurality of resistors R serially connected between VDD and GND to generate a plurality of voltage levels over a voltage range from GND to VDD at nodes ($V_1, \ldots, V_{n-2}, V_{n-1}$ and $V_n$). The MUX (140') comprises a plurality of transmission gates ($TG_1, \ldots TG_{n-2}, TG_{n-1}, TG_n$) each having an input connected to a respective nodes ($V_1, \ldots V_{n-2}, V_{n-1}$ and $V_n$) and having outputs commonly connected to an output node OUT.

Each transmission gate TG comprises a parallel combination of an NMOS transistor (N) and a PMOS transistor (P) with the input at the gate of one transistor being complementary to the input at the gate of the other. In particular, the gates of the NMOS transistors N of transmission gates ($TG_1, \ldots TG_{n-2}, TG_{n-1}, TG_n$) are connected to a respective one of the output bits (1, ... n) of the n-bit dithered control DITH output from the SDM module (130), which serve as select control signals SEL<1>, ... SEL<n>. The gates of the PMOS transistors P of transmission gates ($TG_1, \ldots TG_{n-2}, TG_{n-1}, TG_n$) receives as input complementary versions of respective ones of the output bits (1, ... n) of the n-bit dithered control DITH output from the SDM module (130), which serve as complementary select control signals /SEL<1>, ... /SEL<n>.

In the exemplary circuit of FIG. 2, the DC voltages V1, ..., Vn at various nodes in the voltage divider network (141') provide a potential range of control voltages that can be selectively output from the MUX (140) to the fractional frequency tuning input of the DCO (150). The DC voltages V1, ..., Vn at various nodes in the voltage divider network (141') are applied to the input of respective transmission gates TG1, ..., TGn and selectively output to the output node OUT by selectively activating one of the transmission gates at a given time under control of the DITH bits output from the SDM (130).

Although not shown, each of the n-bits of the DITH control signal can be input to a respective driver block that outputs both inverted and non-inverted versions of the respective input bit, wherein the driver outputs control the gate voltages of respective transmission gates. For a given transmission gate, when the gate input to the NMOS transistor is '0', and the complementary '1' is input to the gate of the PMOS transistor, both are turned off. However when the gate inputs to the NMOS and PMOS transistors are logic "1" and logic "0", both transistors are turned on and the voltage at the input to the transmission gate is passed to the OUT node.

In the exemplary embodiment of FIG. 2, the analog reference voltages generated by the voltage divider (141') include V1=GND and Vn=VDD and a plurality of voltage levels between GND and VDD. The number of analog values that may be used will vary depending on the granularity to achieve a desired level of continuous tuning.

During operation, the MUX (140) is dithered controlled to apply a control voltage with varied reference levels to directly control a voltage controlled tuning element, such as a varactor or other known tuning elements or circuits, to achieve fractional frequency tuning, whereas more coarse frequency tuning can be achieved through digital control of tuning elements using the MSB tuning control bits that are directly input to the DCO (150) from the loop filter (120). For example, the DCO can be a LC tank DCO having switchable capacitance devices, such as varactors, that can be used to control the oscillating frequency. The DCO can be a ring oscillator having an oscillating frequency that can be set by controlling the transconductance or resistance or variable capacitance of its elements.

With these DCO frameworks, one or more varactors can be switched into a high-capacitance mode or a low-capacitance mode individually using digital control (two-level digital control voltage signal), thus achieving a coarse step control for the more-significant bits, and less coarse step control for the less-significant bits. On the other hand, in accordance with an exemplary embodiment of the invention, fine frequency resolution is achieved by controlling a LSB bit (unit varactor) in an analog fashion, wherein the analog control voltage with various reference levels can be applied to a unit varactor to obtain various capacitances values between and including the high and low capacitance states. In this regard, fine frequency tuning resolution of a DCO can be achieved in a digital PLL circuit using a simple analog circuit to generate a fixed range of analog control voltages that are selectively input to the fractional frequency control of a DCO through digital control of an analog multiplexer to drive fractional frequency tuning elements of the oscillator.

Although exemplary embodiments have been described herein with reference to the accompanying drawings, it is to be understood that the present invention is not limited to those exemplary embodiments, and that various other changes and modifications may be affected therein by one skilled in the art without departing from the scope or spirit of the invention. All such changes and modifications are intended to be included within the scope of the invention as defined by the appended claims.

We claim:

1. A phase-locked loop (PLL) circuit, comprising:
   a digitally controlled oscillator (DCO) circuit to generate a DCO output signal in response to a digital frequency tuning control signal comprising an integer portion and a fractional portion;
   a dither control circuit that encodes the fractional portion of the digital frequency tuning control signal to generate a dither control signal; and
   a multiplexer circuit having a plurality of input ports each configured to receive a corresponding one of a plurality of analog control voltages within a fixed voltage range, an output port connected to a fractional frequency control port of the DCO, and a select control port that receives the dither control signal, wherein the multiplexer circuit selectively outputs one of the analog control voltages to the fractional frequency control port of the DCO in response to the dither control signal to drive a fractional frequency tuning element of the DCO using the analog control voltage.

2. The PLL circuit of claim 1, wherein the dithering circuit is a sigma delta modulation circuit.

3. The PLL circuit of claim 1, comprising a digital loop filter that generates the digital frequency control signal, wherein the integer portion is directly input to an integer tracking input control port of the DCO.

4. The PLL circuit of claim 1, comprising an analog reference voltage generator that outputs the fixed range of analog control voltages to the input ports of the multiplexer circuit.

5. The PLL circuit of claim 4, wherein the analog reference voltage generator is a voltage divider network that divides a voltage level of a voltage source to generated the analog control voltages that are applied to the input ports of the multiplexer.

6. The PLL circuit of claim 1, wherein the multiplexer circuit comprises a plurality of transmission gates, wherein each transmission gate has an input connected to one of the input ports of the multiplexer and an output commonly connected to the output port of the multiplexer circuit, and wherein each transmission gate is selectively controlled by one bit of the dither control signal.

7. The PLL circuit of claim 6, wherein each transmission gate is controlled by an inverted and non-inverted version of the one bit of the dither control signal.

8. The PLL circuit of claim 1, wherein the DCO is an LC tank DCO, wherein the fractional frequency tuning element of the DCO is a voltage controlled variable capacitor in a tank circuit.

9. The PLL circuit of claim 1, wherein the dither control signal is an n-bit digital control signal, and wherein the multiplexer circuit is configured to selectively output one of n different analog control voltages at a time in response to the n-bit control signal.

10. A method for frequency tuning a digitally controlled oscillator (DCO) circuit that generates a DCO output signal, comprising:

generating a digital frequency tuning control signal that comprises an integer portion and a fractional portion;

encoding the fractional portion of the digital frequency control signal to generate a dither control signal;

using the dither control signal to selectively switch one of a plurality of analog control voltages within a fixed voltage range for input to a fractional frequency control port of the DCO; and frequency tuning the DCO using the integer portion of the digital frequency tuning control signal for coarse tuning control and using the analog control voltages to drive a fractional frequency tuning element of the DCO for fine resolution tuning control.

11. The method of claim 10, wherein the fractional portion of the digital frequency control signal is encoded using a sigma delta modulation circuit.

12. The method of claim 10, comprising generating the digital frequency tuning control signal using a digital loop filter.

13. The method of claim 10, wherein using the dither control signal comprises applying the dither control signal to a select control port of a multiplexer circuit to selectively output one of the plurality of analog control voltages applied at an input port of the multiplexer.

14. The method of claim 10, wherein using the analog control voltages to drive a fractional frequency tuning element of the DCO for fine resolution tuning control comprises applying the analog control voltage to a voltage controlled capacitor in the DCO circuit.

15. The method of claim 10, comprising generating the plurality of analog reference voltages by dividing a DC voltage from a voltage source using a voltage divider network connected to the voltage source.

16. The method of claim 10, wherein the dither control signal is an n-bit digital control signal, and wherein n-bit dither control signal is used to selectively apply one of n different analog control voltages at a time to the fractional frequency control port of the DCO.

* * * * *